(12) United States Patent
Nam et al.

(10) Patent No.: US 10,036,947 B2
(45) Date of Patent: Jul. 31, 2018

(54) BLANKMASK AND PHOTOMASK USING THE SAME

(71) Applicant: S&S TECH Co., Ltd., Daegu-si (KR)

(72) Inventors: Kee-Soo Nam, Daegu-si (KR); Cheol Shin, Daegu-si (KR); Jong-Hwa Lee, Daegu-si (KR); Chul-Kyu Yang, Daegu-si (KR); Min-Ki Choi, Daegu-si (KR); Chang-Jun Kim, Daegu-si (KR); Young-Jo Jeon, Daegu-si (KR)

(73) Assignee: S&S TECH CO., LTD., Daegu-si (KR)

( * ) Notice: Subject to any disclaimer, the term of this patent is extended or adjusted under 35 U.S.C. 154(b) by 112 days.

(21) Appl. No.: 14/878,419

(22) Filed: Oct. 8, 2015

(65) Prior Publication Data

US 2017/0023854 A1   Jan. 26, 2017

(30) Foreign Application Priority Data

Jul. 24, 2015 (KR) .................. 10-2015-0105326
Sep. 4, 2015 (KR) .................. 10-2015-0125869

(51) Int. Cl.

| | | |
|---|---|---|
| *G03F 1/26* | (2012.01) | |
| *G03F 1/46* | (2012.01) | |
| *G03F 1/54* | (2012.01) | |
| *G03F 1/58* | (2012.01) | |

(52) U.S. Cl.
CPC .................. *G03F 1/26* (2013.01); *G03F 1/46* (2013.01); *G03F 1/54* (2013.01); *G03F 1/58* (2013.01)

(58) Field of Classification Search
CPC ..... G03F 1/26; G03F 1/46; G03F 1/54; G03F 1/58

USPC ............................................................ 430/5
See application file for complete search history.

(56) References Cited

U.S. PATENT DOCUMENTS 9,454,073 B2 * 9/2016 Ha ........................... G03F 1/38

FOREIGN PATENT DOCUMENTS

| JP | 2002-268201 | 9/2002 |
|---|---|---|
| JP | 2011-100108 | 5/2011 |
| JP | 2014-010454 | 1/2014 |
| JP | 2014-194547 | 10/2014 |
| JP | 2015-049455 | 3/2015 |
| JP | 2015-111212 | 6/2015 |
| WO | WO 2013/047195 A1 | 4/2013 |
| WO | WO 2015/045801 A1 | 4/2015 |

OTHER PUBLICATIONS

Office Action in the counterpart app. 2015-195702 dated Jul. 5, 2016 in Japanese.

\* cited by examiner

*Primary Examiner* — Christopher G Young
(74) *Attorney, Agent, or Firm* — Juan Carlos A. Marquez; Marquez IP Law Office, PLLC (57) ABSTRACT

Disclosed are a blankmask and a photomask, in which compositions of metal and light elements of a light-shielding film are controlled so that the light-shielding film can guarantee a light-shielding efficiency, increase an etching speed, become thinner, and have a minimum sheet-resistance. To this end, the blankmask according to the present invention includes at least a light-shielding film on a transparent substrate, and the light-shielding film includes a first light-shielding layer adjacent to the transparent substrate and a second light-shielding layer formed on the first light-shielding layer, in which the first and the second light-shielding film contains chrome (Cr) and molybdenum (Mo).

29 Claims, 7 Drawing Sheets

BLANKMASK AND PHOTOMASK USING THE SAME

CROSS-REFERENCE TO RELATED APPLICATION

This application claims priorities to and the benefit of Korean Patent Applications Nos. KR10-2015-0105326, filed on Jul. 24, 2015 and KR10-2015-0125869, filed on Sep. 4, 2015, the disclosure of which is incorporated herein by reference in its entirety.

BACKGROUND

1. Field of the Invention

The present invention relates to a blankmask and a photomask using the same, and more particularly to a blankmask which can achieve a fine pattern of not greater than 32 nm, preferably not greater than 14 nm, and more preferably not greater than 10 nm, and a photomask using the same.

2. Discussion of Related Art

Today, as a need for a fine circuit pattern has been accompanied by high integration of large-scale integrated circuits (ICs), high semiconductor microfabrication process technology has emerged as a very important issue. To this end, photolithography technology has been developed up to a binary intensity blankmask using a light-shielding film, a phase-shift blankmask using a phase-shift film and a light-shielding film, a hardmask binary blankmask having a hard film and a light-shielding film, etc. so as to improve a resolution of a semiconductor circuit pattern.

By the way, a resist film has recently been continuously required to get thinner in order to achieve high resolution and quality improvement. This is because the thinner resist film causes less scattering of an electron beam while an electron-beam writing process is performed for forming a pattern. However, there is a limit to making the resist film thinner because the resist film is used as an etching mask for forming a pattern of a lower thin film, for example, adjacent thin films such as a light-shielding film, a hard film, etc. and has relatively low selectivity with respect to an etching condition for the lower thin film as it contains major elements of organic substances.

Accordingly, there is a need of improving the properties of the lower film to be etched in order to make the resist film thinner. To this end, a method of increasing an etching speed for the lower film to be etched or a method decreasing the thickness of the lower film to be etched has been proposed.

For example, if the resist film pattern is used in etching the light-shielding film that contains chrome (Cr) as a major element, it is possible to increase the etching speed by plentifully including at least one of oxygen (O) and nitrogen (N) in the light-shielding film. However, the increase in content of one of oxygen (O) and nitrogen (N) makes it difficult to satisfy the optical density, sheet resistance, thickness and the like basic properties required for the light-shielding film. That is, if at least one of oxygen (O) and nitrogen (N) is increased in content, the light-shielding film increases in the sheet resistance and decreases in the optical density, thereby having problems of an electron-charge up phenomenon in an exposure process and deterioration of image contrast. Such problems may be solved by increasing the thickness of the thin film. However, the increased thickness of the light-shielding film increases an aspect ratio of the pattern and causes pattern collapse or the like problem while the pattern is formed.

Accordingly, there is a need of developing a new substance for a light-shielding film which has a higher light-shielding efficiency and a higher etching speed than the existing light-shielding film that contains a compound of chrome (Cr).

SUMMARY OF THE INVENTION

The present invention is directed to a blankmask including a light-shielding film, which guarantees a light-shielding efficiency, increases an etching speed, has a thin thickness and has a minimum sheet-resistance, and a photomask using the same.

Further, the present invention provides a blankmask, which can minimize change in critical dimensions of a light-shielding film and a phase-shift film pattern, and a photomask using the same.

In addition, the present invention provides a blankmask which can achieve a fine pattern of not greater than 32 nm, preferably not greater than 14 nm, and more preferably not greater than 10 nm, and a photomask using the same.

According to an aspect of the present invention, there is provided a blankmask with a light-shielding film on a transparent substrate, the light-shielding film comprising a first light-shielding layer and a second light-shielding layer which are stacked in sequence; and the first light-shielding layer and the second light-shielding layer comprising chrome (Cr) and molybdenum (Mo).

The first light-shielding layer and the second light-shielding layer ma include a compound that contains one or more kinds of substances among nitrogen (N), oxygen (O), carbon (C), boron (B), fluorine (F) and hydrogen (H) in addition to chrome (Cr) and molybdenum (Mo).

The first light-shielding layer and the second light-shielding layer may have a composition ratio: molybdenum (Mo) of 1 at %~20 at %, chrome (Cr) of 10 at %~80 at %, nitrogen (N) of 0~50 at %, oxygen (O) of 0~50 at %, and carbon (C) of 0~30 at %.

According to an aspect of the present invention, there is provided a blankmask with a light-shielding film on a transparent substrate, the light-shielding film comprising a first light-shielding layer and a second light-shielding layer which are stacked in sequence, one of the first light-shielding layer and the second light-shielding layer comprises a light-shielding layer that contains a chrome (Cr) and molybdenum (Mo), and the other one comprises the light-shielding layer that contains chrome (Cr).

According to an aspect of the present invention, there is provided a blankmask with a light-shielding film on a transparent substrate, the light-shielding film comprising chrome (Cr) and molybdenum (Mo).

The light-shielding film may include one among a single-layered film of which composition is uniform, a continuous single-layered film of which composition or composition ratios are varied, and multi-layered films of which films different in composition are stacked more than once in the form of two or more layers.

The light-shielding film may have an etching speed of 1.5 Å/sec~3.5 Å/sec.

The blankmask may further include one or more among a hard film provided on the light-shielding film, a phase-shift film provided beneath the light-shielding film, and an etching-stopping film interposed between the hard film and the light-shielding film.

The blankmask may further include an anti-reflective layer that is provided at least either of on or beneath the light-shielding film and contains one or more kinds of substances among nitrogen (N), oxygen (O), carbon (C), boron (B), fluorine (F) and hydrogen (H) in addition to chrome (Cr) or molybdenum chromium (MoCr).

According to an aspect of the present invention, there is provided a blankmask with a metal film of one or more layers on a transparent substrate, the metal film being formed by a sputtering process using a molybdenum chromium (MoCr) target.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, exemplary embodiments of the present invention will be described in more detail with reference to the accompanying drawings. However, the embodiments are for illustrative and descriptive purposes only and not intended to limit meaning or the scope of the present invention disclosed in claims. Accordingly, it will be appreciated by a person having ordinary knowledge in the art that various modifications and equivalents can be made from these exemplary embodiments. Therefore, the scope of the present invention should be limited only by the accompanying claims.

Figure 1:
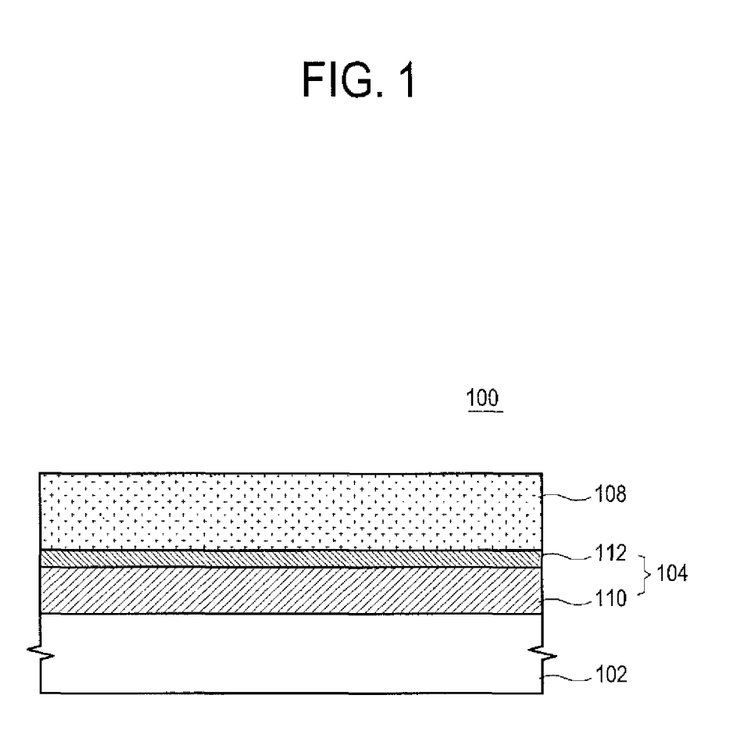
FIG. 1 is a cross-sectional view of a blankmask according to a first embodiment of the present invention.
Figure 2:
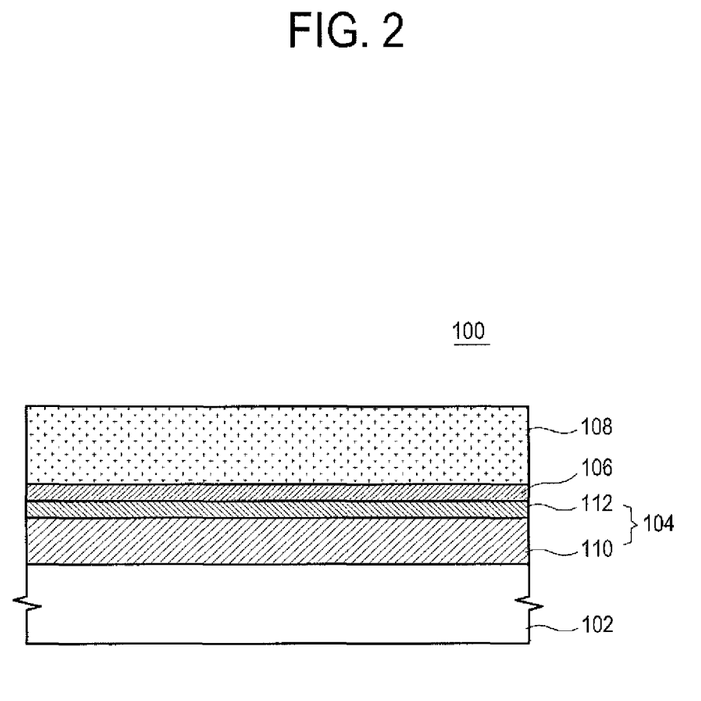
FIG. 2 is a cross-sectional view of a blankmask according to a second embodiment of the present invention.

FIG. 1 is a cross-sectional view of a blankmask according to a first embodiment of the present invention, and FIG. 2 is a cross-sectional view of a blankmask according to a second embodiment of the present invention.

The blankmask 100 according to the present invention includes a light-shielding film 104 having a double-layered structure and stacked on a transparent substrate 102, and a resist film 108 as shown in FIG. 1, or additionally includes an anti-reflective layer 106 formed on the light-shielding film 104 as shown in FIG. 2.

The transparent substrate 102 includes quartz glass, synthetic quartz glass, fluorine-doped quartz glass, etc. having a size of 6 inch×6 inch×0.25 inch in width×length×thickness.

The flatness of the transparent substrate 102 affects the flatness of one among the thin films such as a phase-shift film, a light-shielding film, a hard film, etc. to be formed thereon. If the flatness of the growing film surface is defined as total indicator reading (TIR), the TIR has to be controlled to be not greater than 500 nm, preferably than 200 nm, and more preferably than 100 nm within an area of 142 mm$^2$.

The light-shielding film 104 includes a multi-layered film having two or more layers different in composition or a composition ratio in consideration of a pattern aspect ratio and optical properties in a pattern etching process, and preferably has a two-layered structure of the first light-shielding layer 110 and the second light-shielding layer 112.

The light-shielding film 104 includes a substance that has a high extinction coefficient k in order to improve the light-shielding efficiency and has a low boiling point (B.P.) with respect to etching gas used at dry etching in order to enhance the etching speed.

To this end, a first light-shielding layer 110 and a second light-shielding layer 112 contain molybdenum chromium (MoCr) or one of molybdenum chromium (MoCr) compounds, which contains one of nitrogen (N), oxygen (O) and carbon (C), such as MoCrN, MoCrO, MoCrC, MoCrNO, MoCrCN, MoCrCO and MoCrCON. The first light-shielding layer 110 and the second light-shielding layer 112 may further include a light element such as hydrogen (H), boron (B), etc. in order to reduce stress.

The first light-shielding layer 110 and the second light-shielding layer 112 may have a composition ratio as follows: molybdenum (Mo) of 1 at %~20 at % and preferably 3 at %~10 at %, chrome (Cr) of 10 at %~80 at % and preferably, 20 at %~70 at %, nitrogen (N) of 0~50 at % and preferably not more than 40 at %, oxygen (O) of 0~50 at %, preferably not more than 40 at %, and carbon (C) of 0~30 at %, and preferably not more than 20 at %.

In the light-shielding film 104, molybdenum (Mo) having a higher extinction coefficient k than chrome (Cr) is more contained to thereby increase optical density (OD) per unit thickness. Thus, it is possible to make the light-shielding film thinner. As the light-shielding film 104 contains molybdenum (Mo), it is also possible to noticeably increase the etching speed with respect to chlorine (Cl) gas when the light-shielding film 104 containing the molybdenum chromium (MoCr) compound is dry-etched as compared with that containing the existing chrome (Cr) compound. However, the higher content of molybdenum (Mo) in the light-shielding film 104 weakens resistance to cleaning chemicals used when the photomask is fabricated. Hence, the light-shielding film 104 may preferably contain molybdenum (Mo) content of not more than 20 at %.

In order to improve physical, chemical and optical properties of the light-shielding film 104, one or more light-shielding layers between the first light-shielding layer 110 and the second light-shielding layer 112 may additionally contain one or more kinds of metallic substances among tantalum (Ta), vanadium (V), cobalt (Co), nickel (Ni), zirconium (Zr), niobium (Nb), palladium (Pd), zinc (Zn), aluminum (Al), manganese (Mn), cadmium (Cd), magnesium (Mg), lithium (Li), selenium (Se), copper (Cu), hafnium (Hf) and tungsten (W), and one or more light element among boron (B), fluorine (F) and hydrogen (H).

The light-shielding film 104 may be formed by various methods using a physical or chemical deposition method. Preferably, a direct current (DC) magnetron sputtering apparatus may be used for forming the light-shielding film 104. If such a sputtering method is used to form the light-shielding film 104 containing molybdenum chromium (MoCr) or its compound, the light-shielding film 104 may be formed by a two-component system single target of molybdenum chromium (MoCr). At this time, the molybdenum chromium (MoCr) single target has a composition ratio of molybdenum (Mo):chrome (Cr) 1 at %~30 at %:70 at %~99 at %, and preferably, 1 at %~20 at: 80 at %~99 at %. Further, the light-shielding film 104 may be formed by a co-sputtering method where 2 or more kinds of targets are simultaneously used among targets of molybdenum (Mo), chrome (Cr) and molybdenum chromium (MoCr). At this time, the molybdenum chromium (MoCr) target has a composition ratio of molybdenum (Mo):chrome (Cr)=1~50 at %:50 at %~99 at %.

The first light-shielding layer 110 serves to control the overall optical density (OD) and etching speed of the light-shielding film 104, and the second light-shielding layer 112 serves to compensate for the optical density and lower the sheet resistance. That is, the first light-shielding layer 110 may include one or more between oxygen (O) and nitrogen (N) in order to adjust the optical density of the light-shielding film 104 and raise the etching speed when the light-shielding film pattern is formed. Further, if the optical density is controlled by only the first light-shielding layer 110, there is a problem that the first light-shielding layer 110 becomes thicker so as to satisfy a required light-shielding function. Therefore, the second light-shielding layer 112 is added to compensate for the required optical density. Thus, the second light-shielding layer 112 compensates for the light-shielding efficiency by increasing the optical density per unit thickness. To lower the relatively-high sheet resistance of the first light-shielding layer 110, the second light-shielding layer 112 may not contain oxygen (O), may contain a relatively low content of oxygen (O) as compared with the first light-shielding layer 110 or may contain a relatively high content of nitrogen (N) as compared with the first light-shielding layer 110. Accordingly, the second light-shielding layer 112 is formed to have a higher optical density per unit thickness (A) at an exposure wavelength than the first light-shielding layer 110.

As the second light-shielding layer 112 is used for controlling the sheet resistance, the second light-shielding layer 112 is designed to have a lower sheet resistance than the first light-shielding layer 110. To this end, the second light-shielding layer 112 may additionally contain carbon (C). At this time, carbon (C) may have a content of 1 at %~30 at %. If the content of carbon (C) is more than 30 at %, the optical density decreases and thus the thickness increases.

For example, the second light-shielding layer 112 may contain chrome (Cr) or a chrome (Cr) compound containing at least one among oxygen (O), nitrogen (N) and carbon (C) instead of molybdenum chromium (MoCr) or its compound. However, the second light-shielding layer 112 may contain any substance as long as it can be etched together with the first light-shielding layer 110 in a lump.

As an alternative to the foregoing structure, the light-shielding film 104 may have a structure that the first light-shielding layer 110 contains the chrome (Cr) compound and the second light-shielding layer 112 contains molybdenum chromium (MoCr) or its compound.

The light-shielding film 104 including the first light-shielding layer 110 and the second light-shielding layer 112 has a thickness of 300 Å~700 Å, preferably, 450 Å~600 Å and more preferably 450 Å~550 Å. The thickness of the first light-shielding layer 110 occupies 60%~99% and preferably 70%~98% of the total thickness of the light-shielding film 104. The thickness of the second light-shielding layer 112 occupies 1%~40% and preferably 2%~30% of the total thickness of the light-shielding film 104.

As the light-shielding film 104 contains molybdenum chromium (MoCr), which is composed of molybdenum (Mo), or its compound, the light-shielding efficiency and etching speed of the light-shielding film 104 are remarkably improved as compared with those of the conventional light-shielding film containing the chrome (Cr) compound. That is, the light-shielding film 104 has an etching speed of 1.5 Å/sec~3.5 Å/sec and preferably 1.8 Å/sec~2.5 Å/sec with respect to an etching substance.

Further, the light-shielding film 104 may be achieved by the first light-shielding layer 110 that controls the overall optical density of the light-shielding film 104, and the second light-shielding layer 106 that lowers reflectivity, i.e. serves for antireflection. At this time, the first light-shielding layer 110 may have a lower content of one or more between oxygen (O) and nitrogen (N) than the second light-shielding layer 112 so that the first light-shielding layer 110 can have a higher optical density per unit thickness than the second light-shielding layer 112. In this case, the etching speed of the second light-shielding layer 112 is higher than that of the first light-shielding layer 110. The thickness of the first light-shielding layer 110 occupies 5%~80% and preferably 20%~75% of the total thickness of the light-shielding film 104. The thickness of the second light-shielding layer 112 occupies 10%~95% and preferably 25%~80% of the total thickness of the light-shielding film 104.

Referring to FIG. 2, the anti-reflective layer 106 contains a substance having the same etching properties as that of the light-shielding film 104, and preferably contains one of molybdenum chromium (MoCr) compounds, such as molybdenum chromium (MoCr), MoCrN, MoCrO, MoCrC, MoCrNO, MoCrCN, MoCrCO and MoCrCON. Besides molybdenum chromium (MoCr) or its compound, the anti-reflective layer 106 may have the same etching properties as the light-shielding film 104. The anti-reflective layer 106 may be used as an etching mask for the light-shielding film 104. In this case, the anti-reflective layer 106 may contain a substance having different etching properties from those of the light-shielding film 104.

The light-shielding film 104 or a stacked structure of the light-shielding film 104 and the anti-reflective layer 106 has an optical density of 2.5~3.5 and preferably 2.7~3.2 with respect to an exposure wavelength of 193 nm or 248 nm, and a surface reflectivity of 10%~50% and preferably 20%~40%.

The light-shielding film 104 or a stacked structure of the light-shielding film 104 and the anti-reflective layer 106 selectively undergoes thermal treatment at a temperature of 100° C.~500° C. to thereby have resistance to chemicals and control stress of a thin film. To this end, hot-plate, vacuum rapid thermal annealing, surface plasma processes may be performed.

Figure 3A:
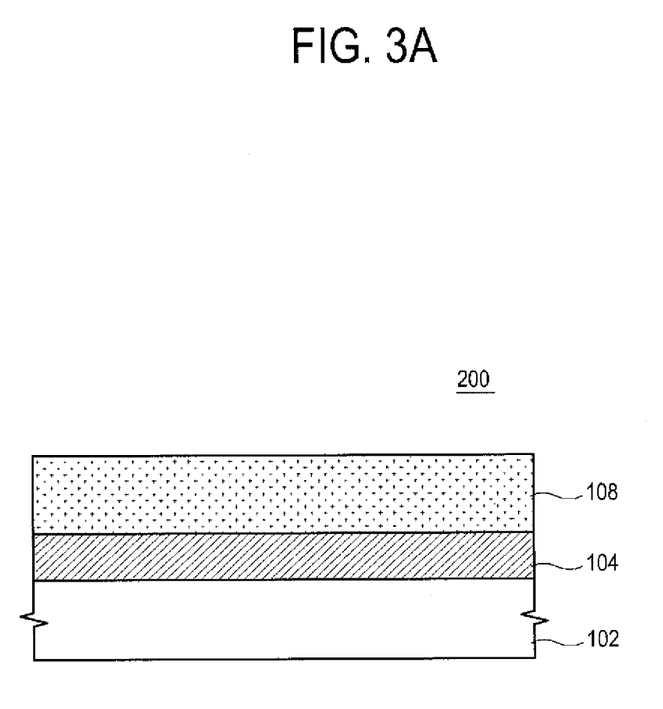
FIGS. 3A and 3B are cross-sectional views of a blankmask according to a third embodiment of the present invention.
Figure 3B:
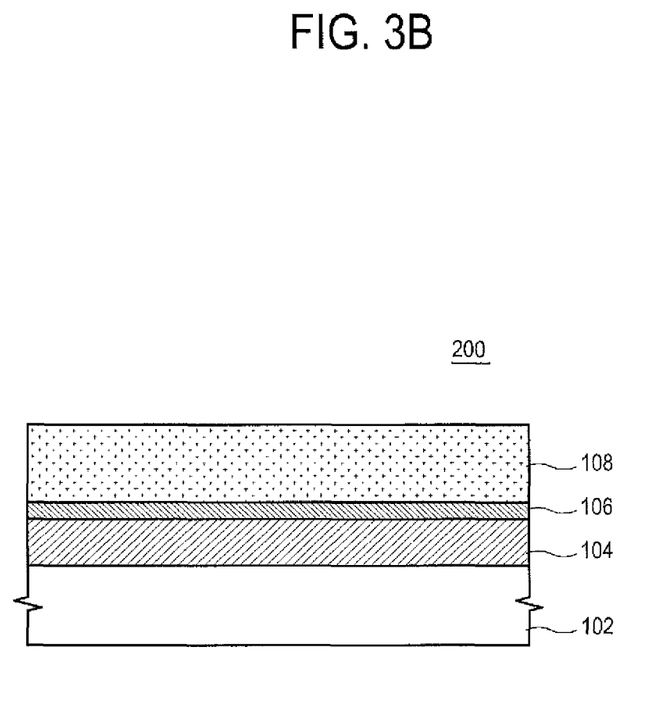

FIGS. 3A and 3B are cross-sectional views of a blank-mask according to a third embodiment of the present invention.

A blankmask 200 according to an embodiment of the present invention may include a light-shielding film 104 having a single-layered structure and stacked on the transparent substrate 102, and a resist film 108 as shown in FIG. 3A, or may additionally include an anti-reflective layer 106 formed on a light-shielding film 104 as shown in FIG. 3B.

One or more between the light-shielding film 104 and the anti-reflective layer 106 may be achieved by one among a single-layered film of which composition is uniform, a continuous single-layered film of which composition or composition ratios are varied, and multi-layered films of which films different in composition are stacked more than once in the form of two or more layers.

The light-shielding film 104 and the anti-reflective layer 106 have the same optical, chemical and physical properties, contains the same substance and is fabricated by the same method as those of the foregoing first and second embodiments of the present invention.

Figure 4:
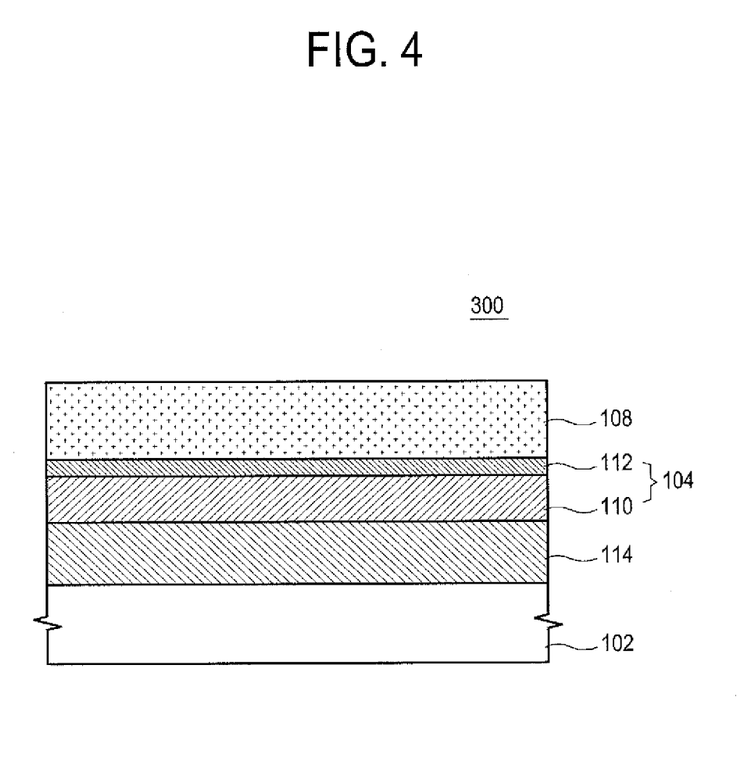
FIG. 4 is a cross-sectional view of a blankmask according to a fourth embodiment of the present invention.

FIG. 4 is a cross-sectional view of a blankmask according to a fourth embodiment of the present invention.

Referring to FIG. 4, a blankmask 300 according to an embodiment of the present invention is a phase-shift blankmask and includes a phase-shift film 114, a light-shielding film 104 and a resist film 108, which are stacked in sequence on a transparent substrate 102. Here, the light-shielding film 104 has the same optical, chemical and physical properties, contains the same substance and is fabricated by the same method as those of the first embodiment of the present invention.

The phase-shift film 114 may contain a substance that has an etching selectivity higher than 10 against the light-shielding film 104 while a light-shielding film pattern is etched using the etching mask. The phase-shift film 114 contains a substance that has a high refractive index and a high extinction coefficient in order to make its thickness thinner and improve resistance to chemicals while maintaining the optical properties. To this end, the phase-shift film 114 may contain one or more kinds of metallic substance among molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf) and tungsten (W), or may contain one or more kinds of substances among nitrogen (N), oxygen (O), carbon (C), boron (B) and hydrogen (H) in addition to the foregoing metallic substance.

Preferably, the phase-shift film 114 includes a metal silicide mixture that contains transition metal such as silicon (Si) or molybdenum (Mo), or a compound that contains one or more light elements among nitrogen (N), oxygen (O) and carbon (C) in addition to the metal silicide mixture. The phase-shift film 114 may for example includes one among Si, SiN, SiC, SiO, SiCN, SiCO, SiNO, SiCON, MoSi, MoSiN, MoSiC, MoSiO, MoSiCN, MoSiCO, MoSiNO and MoSiCON. The phase-shift film 114 may additionally include one or more light elements among boron (B), fluorine (F) and hydrogen (H) in consideration of the optical, chemical and physical properties and fabricating processes.

The phase-shift film 114 may be achieved by one among a single-layered film of which composition is uniform, a continuous single-layered film of which composition or composition ratios are varied, and multi-layered films of which films different in composition are stacked more than once in the form of two or more layers.

The phase-shift film 114 may contain oxygen (O) on its top or uppermost layer. Specifically, if the phase-shift film 114 contains a molybdenum silicide (MoSi) compound, the phase-shift film 114 is vulnerable to cleaning chemicals such as ozone ($O_3$), Hot-DI, ammonia ($NH_4OH$), sulfuric acid ($H_2SO_4$), etc. If the phase-shift film 114 is damaged by the foregoing substances or the like in a cleaning process or the like, the phase-shift film 114 cannot have required optical properties since it becomes thinner, increases in transmissivity and varies in phase-shift. Accordingly, the top or uppermost film of the phase-shift film 114 according to the present invention may be for example made of MoSiON containing oxygen (O), and thus protects the phase-shift film 114 from deterioration such as dissolution or corrosion due to cleaning chemicals. At this time, the top or uppermost film of the phase-shift film 114 contains oxygen (O) of 0.1 at %~20 at %. A portion of the phase-shift film 114 arranged beneath the top or uppermost film may be variously achieved by a film that is different in composition and composition ratio from those of the top or uppermost film.

The phase-shift film 114 has a thickness of 300 Å~900 Å, and preferably 500 Å~700 Å. If the phase-shift film 114 is formed to contain oxygen (O) in its top or uppermost film, a section of the top or uppermost film containing oxygen (O) may have a thickness of 10 Å~100 Å, and occupies 1%~40% and preferably 1%~10% of the total thickness of the phase-shift film 114.

The phase-shift film 114 has a transmissivity of 5%~40% with respect to exposure light having a wavelength of 193 nm or 248 nm, and is shifted in phase by 170°~190°. If the phase-shift film 114 has a transmissivity lower than 5%, there is a feeble phase-shift effect since the intensity of the exposure light for destructive interference is lowered when a resist film applied to a wafer is exposed to light. If the phase-shift film 114 has a transmissivity higher than 40%, there is a loss in the resist film since the resist film applied to the waver is damaged at the exposure process.

A structure where the light-shielding film 104 and the phase-shift film 114 are stacked in sequence has an optical density of 2.5~3.5 and preferably 2.7~3.2 and a reflectivity of 10%~45% and preferably 25%~35% with respect to the exposure light having a wavelength of 193 nm or 248 nm.

The phase-shift film 114 may selectively undergo thermal treatment at a temperature of 100° C.~500° C. to thereby have resistance to chemicals and control flatness, in which the thermal treatment may be performed at the same or higher temperature as or than that for the light-shielding film 104.

Further, the etching process for forming a pattern of the phase-shift film 114 may be performed by continuously etching the light-shielding film 104 and the phase-shift film 114 in the state that the resist film pattern is remained. This is to make up for deviation in critical dimension (CD), which is made when the patterns of the light-shielding film 104 and the phase-shift film 114 are formed. Thus, it is possible to compensate for difference in between the light-shielding film pattern and the phase-shift film pattern by using a byproduct of the resist pattern produced when the phase-shift film 114 is etched to form a pattern.

Figure 5:
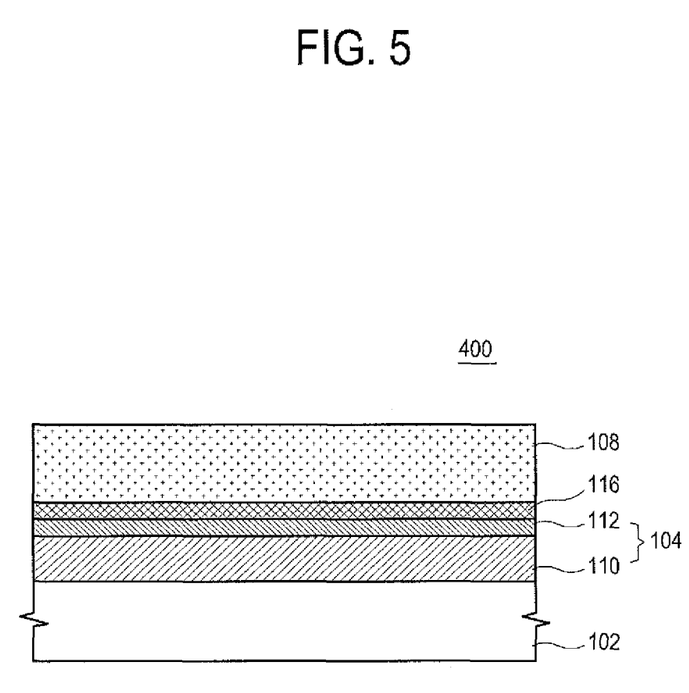
FIG. 5 is a cross-sectional view of a blankmask according to a fifth embodiment of the present invention.

FIG. 5 is a cross-sectional view of a blankmask according to a fifth embodiment of the present invention.

Referring to FIG. 5, a blankmask 400 according to the present invention includes a light-shielding film 104, a hard film 116 and a resist film 108 which are stacked in sequence on a transparent substrate 102. Here, the light-shielding film 104 has the same optical, chemical and physical properties, contains the same substance and is fabricated by the same method as those of the first embodiment of the present invention.

The hard film 116 serves as an etching mask for the light-shielding film 104, and thus contains a substance that has an etching selectivity higher than 10 against the light-shielding film 104. The hard film 116 may contain one or more kinds of substances among molybdenum (Mo), tantalum (Ta), vanadium (V), cobalt (Co), nickel (Ni), zirconium (Zr), niobium (Nb), palladium (Pd), zinc (Zn), chrome (Cr), aluminum (Al), manganese (Mn), cadmium (Cd), magnesium (Mg), lithium (Li), selenium (Se), copper (Cu), hafnium (Hf), tungsten (W), tin (Sn) and silicon (Si), or may contain one or more kinds of substances among nitrogen (N), oxygen (O), carbon (C), boron (B) and hydrogen (H) in addition to the foregoing substance. For example, the hard film 116 may contain tantalum oxynitride (TaON) or the like.

The hard film 116 has a thickness of 10 Å~100 Å and preferably 20 Å~60 Å.

The hard film 116 may be made of a compound that contains silicon (Si). In this case, adhesion between the hard film 116 and the resist film 108 may be weak. To make the adhesion stronger, an upper surface of the hard film 116 may undergo one or more between surface reforming and surface treatment.

The surface reforming for the hard film 116 is performed by thermal treatment or a plasma process using one or more gas among oxygen (O), nitrogen (N), hydrogen (H), carbon (C) and fluorine (F). The thermal treatment and the plasma process may include a method of using vacuum rapid thermal treatment and a method of using atmospheric pressure plasma, but not limited thereto. Through the surface reforming, the surface of the hard film 116 can have a contact angle of 15°~50° and preferably 20°~45°.

Further, the surface treatment may be performed by applying a high-molecular compound that contains silicon. The high-molecular compound containing silicon may be one or more among hexamethyldisilane, trimethylsilyldi-ethyl-amine, O-trimethylsilylacetate, O-trimethylsilyl-propionate, O-trimethylsilylbutyrate, trimethylsilyl-trifluoro-acetate, trimethylmethoxysilane, N-methyl-Ntrimethylsilyltrifluoroacetate, O-trimethylsilyacetylacetone, isopropenoxy-trimethylsi-lane, trimethylsilyl-trifluoroacetamide, methyltrimethyl-silyldimethylketoneacetate, and trimethyl-ethoxysilane.

If the hard film 116 contains a substance that has a low etching selectivity against the lower light-shielding film 104, an etching-stopping film (not shown) may be interposed in between the hard film 116 and the light-shielding film 104. The etching-stopping film is made of a substance that has an etching selectivity higher than 10 against the light-shielding film 104 and the hard film 116.

The etching-stopping film may include one or more kinds of substances among silicon (Si), molybdenum (Mo), tantalum (Ta), vanadium (V), cobalt (Co), nickel (Ni), zirconium (Zr), niobium (Nb), palladium (Pd), zinc (Zn), chrome (Cr), aluminum (Al), manganese (Mn), cadmium (Cd), magnesium (Mg), lithium (Li), selenium (Se), copper (Cu), hafnium (Hf), tungsten (W), tin (Sn), or, the foregoing substances with added one or more kinds of substances among nitrogen (N), oxygen (O), carbon (C), boron (B) and hydrogen (H). The etching-stopping film has a thickness of 10 Å~150 Å and preferably 20 Å~100 Å.

Figure 6:
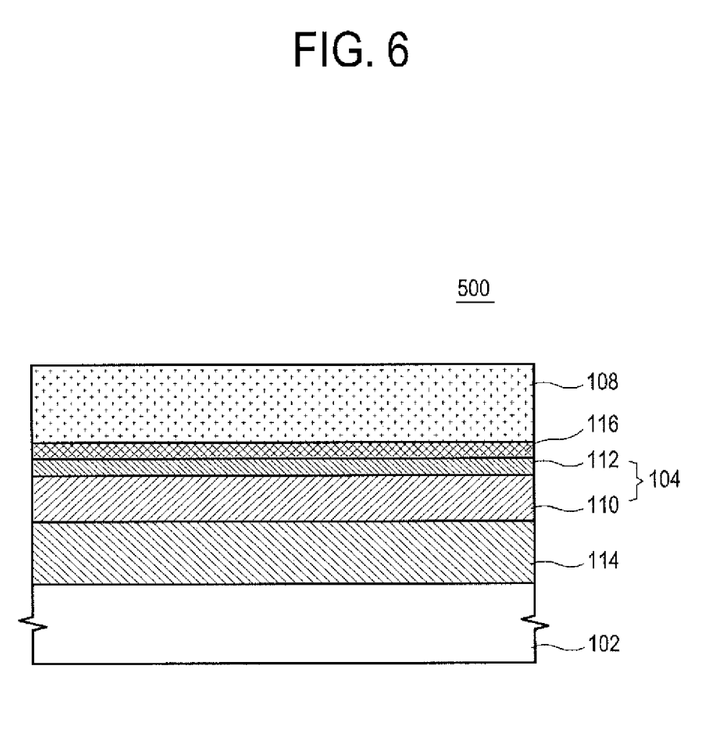
FIG. 6 is a cross-sectional view of a blankmask according to a sixth embodiment of the present invention.

FIG. 6 is a cross-sectional view of a blankmask according to a sixth embodiment of the present invention.

Referring to FIG. 6, a blankmask 500 according to an embodiment of the present invention is a blankmask including the elements of the foregoing embodiments, which includes a phase-shift film 114, a light-shielding film 104, a hard film 116 and a resist film 108, which are stacked in sequence on a transparent substrate 102. Here, the light-shielding film 104, the phase-shift film 114, the hard film 116, and the etching-stopping film have the same optical, chemical and physical properties, contains the same substance and is fabricated by the same method as those of the first to sixth embodiments of the present invention As necessary, an anti-reflective layer (not shown) may be provided either on or beneath the light-shielding film 104 according to the fourth to sixth embodiment of the present invention and prevent the exposure light from being reflected again. The anti-reflective layer has the same optical, chemical and physical properties, contains the same substance and is fabricated by the same method as those of the second and third embodiments of the present invention. Further, the phase-shift film, the hard film, the etching-stopping film, or the like various thin films provided on or beneath the light-shielding film 104 are equally applied to the foregoing third embodiment of the present invention.

In addition, the two-component system single target of molybdenum chromium (MoCr) and two or more kinds of targets among molybdenum (Mo), chrome (Cr) and molybdenum chromium (MoCr) targets used in the co-sputtering method to form the light-shielding film according to the present invention may be also used for forming a metal film including a light-shielding film of a blankmask for fabricating not only a semiconductor device but also a flat panel display device such as a thin film transistor liquid crystal display (TFT-LCD), an organic light emitting diode (OLED), a plasma display panel (PDP), etc.

Further, the target may be not limited to light-shielding film but used for any thin film including a metal film for a semiconductor and a flat panel display (FPD), for example, the light-shielding film, the anti-reflective layer, the phase-shift film, the hard film, the etching-stopping film, and a transflective film.

Below, the blankmask according to an embodiment of the present invention will be described in detail.

EMBODIMENTS

Embodiment 1-1: Fabrication and Test 1 of a Binary Blankmask and a Photomask

Referring to FIG. 1, a binary blankmask and a photomask, which include a light-shielding film 104 containing a MoCr compound and having a two-layered structure where a first light-shielding layer 110 and a second light-shielding layer 112 are stacked, were fabricated and tested in the embodiment 1-1.

To fabricate the binary blankmask 100, process gas of $Ar:N_2:CO_2=3$ sccm:8 sccm:5 sccm was injected on a transparent substrate 102 having a flatness of 154 nm and a double-refractive index of 2 nm/6.35 mm through an DC magnetron reactive sputtering apparatus loaded with a molybdenum chromium (MoCr) target (Mo:Cr=10 at %:90 at %), and process power of 0.75 kW was applied to thereby form the first light-shielding layer 110 of a MoCrCON film having a thickness of 550 Å. Then, process gas of $Ar:N_2=5$ sccm:5 sccm was injected, and process power of 1.0 kW was applied to thereby form the second light-shielding layer 112 of a MoCrN film having a thickness of 50 Å. Ultimately, the light-shielding film 104 having the two-layered structure was formed.

After applying vacuum rapid thermal process (RTP) to the light-shielding film 104 at a temperature of 350° for 30 minutes, the properties of the light-shielding film 104 were tested.

As results from testing the transmissivity and reflectivity of the light-shielding film 104 through a UV-VIS spectrometer, the transmissivity was 0.09% and the reflectivity was 30.3% at a wavelength of 193 nm. Accordingly, it is understood that the optical properties of the light-shielding film are excellent.

Further, the thin film stress of the light-shielding film 104 was tested through an ultra-flat apparatus. In result, the light-shielding film 104 had TIR of 198 nm, which was different by 44 nm from the TIR of the transparent substrate 102 having TIR of 154 nm. Accordingly, it is appreciated that there is no problem in pattern alignment after forming the pattern.

In addition, the sheet resistance of the light-shielding film 104 was tested using a 4-point probe. In result, the light-shielding film 104 had a sheet resistance of 324Ω/□. Accordingly, it is determined that there is no charge up phenomenon in an exposure process using an electron beam.

Besides, the composition ratio of the first light-shielding layer 110 was analyzed using an Auger analysis apparatus. In result, the first light-shielding layer 110 had a composition ratio of Mo:Cr:light element (one or more among O, C and N)=5 at %:40 at %:55 at %, and the second light-shielding layer 112 had a composition ratio of Mo:Cr:light element (one or more among O, C and N)=8 at %:60 at %:32%.

Additionally, the first light-shielding layer 110 and the second light-shielding layer 112 were tested with regard to the optical density per unit thickness. In result, the first light-shielding layer 110 had an optical density of 0.0054/Å, and the second light-shielding layer 112 had an optical density of 0.01/Å. Hence, it is appreciated that the second light-shielding layer 112 has a relatively higher optical density per unit thickness.

Then, a positive chemically-amplified resist film 108 was formed to have a thickness of 1,000 Å on the light-shielding film 104, thereby completing the fabrication of the binary blankmask.

The photomask was fabricated using the binary blankmask and tested as follows.

First, the resist film 108 was exposed to light through an exposure apparatus, underwent post exposure back (PEB) at a temperature of 110° C. for 10 minutes, and was developed to thereby form a resist film pattern. Then, the resist film pattern was used as an etching mask to dry-etch the lower light-shielding film 104 containing the MoCr compound by the etching gas containing chlorine (Cl) gas to thereby form a light-shielding film pattern, and the resist film pattern was removed, thereby completing the fabrication of the photomask.

The etching speed of the light-shielding film 104 was tested by end point detection (EPD). In result, the light-shielding film 104 had a high etching speed of 2.03 Å/sec. The thickness of the remaining resist film pattern was also tested by the AFM apparatus. In result, the remaining resist film pattern had a thickness of 520 Å. Further, a loading test resulted in about 3.5 nm, which was superior to the light-shielding film of a chrome (Cr) compound according to comparative examples to be described later. Here, the loading test exhibits deviation in critical dimension (CD) between loading 0% and 100% patterns.

Embodiment 1-2: Fabrication and Test II of a Binary Blankmask and a Photomask

Referring to FIG. 1, a binary blankmask and a photomask, which include a light-shielding film 104 containing a MoCr compound and having a two-layered structure where a first light-shielding layer 110 and a second light-shielding layer 112 are stacked, were fabricated and tested in the embodiment 1-2. Here, the first light-shielding layer 110 has a higher optical density per unit thickness than the second light-shielding layer 112, and the second light-shielding layer 112 serves for anti-reflection to thereby lower the reflectivity of the light-shielding film 104.

To fabricate the binary blankmask 100, process gas of Ar:N$_2$=5 sccm:7 sccm was injected on a transparent substrate 102 through an DC magnetron reactive sputtering apparatus loaded with a molybdenum chromium (MoCr) target (Mo:Cr=10 at %:90 at %), and process power of 1.0 kW was applied to thereby form the first light-shielding layer 110 of a MoCrN film having a thickness of 450 Å. Then, process gas of Ar:N$_2$:NO=3 sccm:8 sccm:3 sccm was injected, and process power of 0.7 kW was applied to thereby form the second light-shielding layer 112 of a MoCrON film having a thickness of 150 Å.

After applying vacuum rapid thermal process (RTP) to the light-shielding film 104 formed by stacking the first light-shielding layer 110 and the second light-shielding layer 112 at a temperature of 350° for 30 minutes, the properties of the light-shielding film 104 were tested.

With respect to the waveform of 193 nm, the light-shielding film 104 had a transmissivity of 0.08% and a reflectivity of 18.2%. Hence, it is understood that the light-shielding film 104 is excellent in optical properties as the light-shielding film and decreases in reflectivity as compared with that of the foregoing embodiment 1-1.

As a result from testing the thin film stress of the light-shielding film 104, the light-shielding film 104 was different in TIR by 52 nm from the transparent substrate 102. Accordingly, it is appreciated that there is no problem in pattern alignment after forming the pattern.

In addition, as a result from testing the sheet resistance of the light-shielding film 104, the light-shielding film 104 had a sheet resistance of 485Ω/□. Accordingly, it is determined that there is no charge up phenomenon in an exposure process using an electron beam.

Besides, as a result from analyzing the composition ratio of the first light-shielding layer 110, the first light-shielding layer 110 had a composition ratio of Mo:Cr:light element (one or more among O, C and N)=9 at %:62 at %:29 at %, and the second light-shielding layer 112 had a composition ratio of Mo:Cr:light element (one or more among O, C and N)=6 at %:46 at %:48%.

Additionally, the first light-shielding layer 110 and the second light-shielding layer 112 were tested with regard to the optical density per unit thickness. In result, the first light-shielding layer 110 had an optical density of 0.006/Å, and the second light-shielding layer 112 had an optical density of 0.002/Å. Hence, it is appreciated that the second light-shielding layer 112 has a relatively lower optical density per unit thickness.

Then, a positive chemically-amplified resist film 108 was formed to have a thickness of 1,000 Å on the light-shielding film 104, thereby completing the fabrication of the binary blankmask.

The photomask was fabricated using the binary blankmask and tested as follows.

The light-shielding film 104 had an etching speed of 1.6 Å/sec, and the resist film pattern having a thickness of 420 Å was remained. Further, a loading test resulted in about 3.9 nm, which was superior to the light-shielding film of a chrome (Cr) compound according to comparative examples to be described later.

Embodiment 1-3: Fabrication and Test II of a Binary Blankmask and a Photomask

Referring to FIG. 1, a binary blankmask 100 and a photomask, which include a light-shielding film 104 having a two-layered structure where a first light-shielding layer 110 containing a MoCr compound and a second light-shielding layer 112 containing a Cr compound are stacked, were fabricated and tested in the embodiment 1-3.

To fabricate the binary blankmask 100, the same light-shielding film 104 having the two-layered structure as the binary blankmask of the foregoing embodiment 101 was formed on the transparent substrate 102.

To fabricate the binary blankmask 100, process gas of Ar:$N_2$:$CO_2$=3 sccm:8 sccm:5 sccm was injected on a transparent substrate 102 through an DC magnetron reactive sputtering apparatus loaded with a molybdenum chromium (MoCr) target (Mo:Cr=10 at %:90 at %), and process power of 0.75 W was applied to thereby form the first light-shielding layer 110 of a MoCrCON film having a thickness of 550 Å. Then, process gas of Ar:$N_2$=5 sccm:5 sccm was injected using a chrome (Cr) target, and process power of 1.0 kW was applied to thereby form the second light-shielding layer 112 of a CrN film having a thickness of 50 Å. Ultimately, the light-shielding film 104 having the two-layered structure was formed.

With regard to a wavelength of 193 nm, the light-shielding film 104 had a transmissivity of 0.11% and a reflectivity of 33.5%, and thus had a relatively low light-shielding efficiency under the same thickness as compared with that of the foregoing embodiment 1-1. However, the light-shielding film 104 had an optical density of 2.96, which exhibits a sufficient light-shielding efficiency. Therefore, there is no problem in using the light-shielding film 104 as the light-shielding film.

When the photomask is fabricated, the light-shielding film 104 had an etching speed of 1.83 Å/sec, and the loading test resulted in 4.2 nm, which was superior to the light-shielding film of a chrome (Cr) compound according to comparative examples to be described later.

Embodiment 1-4: Fabrication and Test IV of a Binary Blankmask and a Photomask

Referring to FIG. 1, a binary blankmask and a photomask, which include a light-shielding film 104 having a two-layered structure where a first light-shielding layer 110 containing a Cr compound and a second light-shielding layer 112 containing a MoCr compound are stacked, were fabricated and tested in the embodiment 1-4.

To fabricate the binary blankmask 100, the light-shielding film 104 having an inversed structure, in which the first light-shielding film 110 and the second light-shielding film 112 were arranged at inverse positions to those of the binary blankmask described in the embodiment 1-3, was formed on the transparent substrate 102.

To fabricate the binary blankmask 100, process gas of Ar:$N_2$=5 sccm:5 sccm was injected using a chrome (Cr) target on a transparent substrate 102, and process power of 1.0 kW was applied to thereby form the first light-shielding layer 110 of a CrN film having a thickness of 50 Å. Then, process gas of Ar:$N_2$:$CO_2$=3 sccm:8 sccm:5 sccm was injected through an DC magnetron reactive sputtering apparatus loaded with a molybdenum chromium (MoCr) target (Mo:Cr=10 at %:90 at %), and process power of 0.75 kW was applied to thereby form the second light-shielding layer 112 of a MoCrCON film having a thickness of 550 Å. Ultimately, the light-shielding film 104 was formed.

With regard to a wavelength of 193 nm, the light-shielding film 104 had a transmissivity of 0.11% and a reflectivity of 23.5%. This result shows that the transmissivity is the same as but the reflectivity is lower than those of the embodiment 1-3 under the wavelength of 193 nm.

Further, as a result of testing the etching speed of the light-shielding film 104, the light-shielding film 104 had an etching speed of 1.81 Å/sec. The loading test resulted in 4.2 nm, which was the same as that of the embodiment 1-3. Hence the light-shielding film 104 was superior to the light-shielding film of a chrome (Cr) compound according to the comparative examples to be described later.

Embodiment 2

Fabrication and Test V of a Binary Blankmask and a Photomask

Referring to FIG. 2, a binary blankmask 100 and a photomask, which include a light-shielding film 104 containing a MoCr compound and having a two-layered structure where a first light-shielding layer 110 and a second light-shielding layer 112 are stacked, and an anti-reflective layer 106 on the light-shielding film 104, were fabricated and tested in the embodiment 2.

To fabricate the binary blankmask 100, the light-shielding film 104 having the same two-layered structure as the binary blankmask of the foregoing embodiment 1-1 was formed on the transparent substrate 102.

Like the light-shielding film 104, the anti-reflective layer 106 was then formed as a MoCrON film having a thickness of 100 Å, by using molybdenum chromium (MoCr) target (Mo:Cr=10 at %:90 at %), injecting process gas of Ar:$N_2$:NO=5 sccm:5 sccm:5 sccm, and applying process power of 0.7 kW.

The stacked structure of the light-shielding film 104 and the anti-reflective layer 106 had an optical density of 3.12 and a reflectivity of 26.3% at the wavelength of 193 nm. This shows that the reflectivity is lowered as compared with the embodiment 1-1.

Embodiment 3: Fabrication and Test VI of a Binary Blankmask and a Photomask

Referring to FIG. 3A, a binary blankmask 200 and a photomask, which includes a light-shielding film 104 containing a MoCr compound and having a single-layered structure, where fabricated and tested in the embodiment 3.

To fabricate the binary blankmask 200, process gas of Ar:$N_2$:$CO_2$=3 sccm:5 sccm:4 sccm was injected on the transparent substrate 102 through an DC magnetron reactive sputtering apparatus loaded with a molybdenum chromium (MoCr) target (Mo:Cr=10 at %:90 at %), and process power of 0.75 kW was applied to thereby form the light-shielding layer 110 of a MoCrCON film having a thickness of 650 Å.

After applying vacuum rapid thermal process (RTP) to the light-shielding film 104 at a temperature of 350° for 30 minutes, the properties of the light-shielding film 104 were tested.

With respect to a wavelength of 193 nm, the light-shielding film 104 had a transmissivity of 0.09% and a reflectivity of 26.5%. Accordingly, it is understood that the light-shielding film 104 is excellent in the optical properties as the light-shielding film.

Further, the thin film stress of the light-shielding film 104 was tested. In result, the light-shielding film 104 is different in TIR by 45 nm from the transparent substrate 102. Accordingly, it is appreciated that there is no problem in pattern alignment after forming the pattern.

Besides, the light-shielding film 104 had a sheet resistance of 852Ω/□. Accordingly, it is determined that there is no charge up phenomenon in an exposure process using an electron beam.

In addition, in the case where the anti-reflective layer 106 is formed on the light-shielding film 104 as shown in FIG. 3B, the foregoing anti-reflective layer of the embodiment may be applied to the anti-reflective layer 106.

Embodiment 4: Fabrication and Test of a Phase-Shift Blankmask and a Photomask

Referring to FIG. 4, a phase-shift blankmask 300 and a photomask, which include a light-shielding film 104 containing a MoCr compound and having a two-layered structure where a first light-shielding layer 110 and a second light-shielding layer 112 are stacked, and a phase-shift film 114 formed beneath the light-shielding film 104, were fabricated and tested in the embodiment 4.

To fabricate the phase-shift blankmask 300, the phase-shift film 114 was formed with a molybdenum silicide (MoSi) compound to have a transmissivity of 6%, a phase-shift of 180° and a thickness of 650 Å on the transparent substrate 102 through a DC magnetron reactive sputtering apparatus loaded with a molybdenum chromium (MoCr) target (Mo:Cr=10 at %:90 at %).

After applying vacuum rapid thermal process (RTP) to the phase-shift film 114 at a temperature of 350° for 30 minutes, the stress was tested. In result, the phase-shift film 114 had a TIR of 212 nm, which is different in TIR by 58 nm from the transparent substrate 102. Accordingly, it is appreciated that there is no problem in pattern alignment after forming the pattern.

Subsequently, process gas of $Ar:N_2:CO_2=3$ sccm:9 sccm:10 sccm was injected on the phase-shift film 114 while using the molybdenum chromium (MoCr) target (Mo:Cr=10 at %:90 at %), and process power of 0.75 kW was applied to thereby form the first light-shielding layer 110 of a MoCr-CON film having a thickness of 500 Å. Then, process gas of $Ar:N_2=5$ sccm:5 sccm was injected, and process power of 1.0 kW was applied to thereby form the second light-shielding layer 112 of a MoCrN film having a thickness of 50 Å.

After applying vacuum rapid thermal process (RTP) to the light-shielding film 104 at a temperature of 350° for 30 minutes, the properties of the light-shielding film 104 were tested.

As a result from testing the thin film stress of the light-shielding film 104, the light-shielding film 104 is different in TIR by 35 nm from the phase-shift film 114. Accordingly, it is appreciated that there is no problem in pattern alignment after forming the pattern.

As a result from analyzing the composition ratio of the light-shielding layer 104, the first light-shielding layer 110 had a composition ratio of Mo:Cr:light element (one or more among O, C and N)=4 at %:32 at %:64 at %, and the second light-shielding layer 112 had a composition ratio of Mo:Cr:light element (one or more among O, C and N)=8 at %:60 at %:32%.

In addition, the stacked structure of the phase-shift film 114 and the light-shielding film 104 had a transmissivity of 0.09%, an optical density of 3.04, and a reflectivity of 32.5% with respect to a wavelength of 193 nm. Accordingly, it is understood that this stacked structure has no problem in optical properties as the light-shielding film.

Then, a positive chemically-amplified resist film 108 was formed on the light-shielding film 104 to have a thickness of 800 Å, thereby completing fabrication of the phase-shift blankmask 300.

Using the phase-shift blankmask 300, the light-shielding film 104 was etched to form a pattern, and this pattern was used as an etching mask to etch the phase-shift film 114 and form the resist film pattern, thereby selectively removing the light-shielding film pattern in a main pattern area and thus fabricating the photomask.

The light-shielding film 104 had an etching speed of 2.5 Å/sec faster than that of the embodiment 1-1, and it was determined that this was caused by increasing flux of carbon dioxide ($CO_2$) gas in order to improve the etching speed under the same optical density due to the presence of the lower phase-shift film 114.

Embodiment 5: Fabrication of a Binary Blankmask with a Hard Film

Referring to FIG. 5, a binary blankmask 400, which includes a light-shielding film 104 containing a MoCr compound and having a two-layered structure where a first light-shielding layer 110 and a second light-shielding layer 112 are stacked, and a hard film 116 formed on the light-shielding film 104, was fabricated in the embodiment 5.

To fabricate the binary blankmask 400 including the hard film, the light-shielding film 104 having the same two-layered structure as that of the foregoing embodiment 1-1 was formed on the transparent substrate 102. Then, the hard film 116 was formed to have a thickness of 40 Å by using a silicon (Si) target doped with boron (B), injecting process gas of Ar:NO:N2=5 sccm:8 sccm:3 sccm, and supplying process power of 0.7 kW.

Then, the surface of the hard film 116 was treated by a HMDS process, and the positive chemically-amplified resist film 108 was formed to have a thickness of 800 Å on the hard film 116, thereby completing the fabrication of the binary blankmask 400.

Embodiment 6: Fabrication of a Phase-Shift Blankmask with a Hard Film

Referring to FIG. 6, a phase-shift blankmask 500, which includes a light-shielding film 104 containing a MoCr compound and having a two-layered structure where a first light-shielding layer 110 and a second light-shielding layer 112 are stacked, and a phase-shift film 114 and a hard film 116 respectively formed beneath and on the light-shielding film 104, was fabricated in the embodiment 6.

To fabricate the phase-shift blankmask 500 including the hard film, the phase-shift film 114 and the light-shielding film 104 having the same two-layered structure were formed on the transparent substrate 102 like the foregoing phase-shift blankmask of the embodiment 4, and then the hard film 116 was formed like that of the foregoing embodiment 5.

Then, the surface of the hard film 116 was treated by a HMDS process, and the positive chemically-amplified resist film 108 was formed to have a thickness of 800 Å on the hard film 116, thereby completing the fabrication of the binary blankmask 400.

Comparative Examples: Test of the Light-Shielding Films Containing a Cr Compound In order to distinguish the properties of the light-shielding film containing the MoCr compound according to the foregoing embodiments of the present invention, the light-shielding films having the two-layered structure and containing the Cr compound were formed and tested.

raise the etching speed of the light-shielding film. In result, the etching speed is raised up in proportion to the increased content of oxygen (O). However, as compared with those of the foregoing embodiments of the present invention, the optical density is relatively low since the thickness increases, and the etching speed is also low, thereby increasing the difference in the critical dimension.

TABLE 1

|  |  | Comparative example 1 | Comparative example 2 | Comparative example 3 | Comparative example 4 |
|---|---|---|---|---|---|
| First light-shielding layer | Substances | CrN | CrON | CrCON | CrCON |
| First light-shielding layer | Film growing conditions | Ar:N2 = 5:3 | Ar:N2:NO = 5:3:5 | Ar:N2:CO2 = 5:3:5 | Ar:N2:CO2 = 5:3:8 |
|  | Thickness | 550 Å | 550 Å | 550 Å | 550 Å |
| Second light-shielding layer | Substances | CrON | CrON | CrCON | CrN |
| Second light-shielding layer | Film growing conditions | Ar:N2:No = 5:5:5 | Ar:N2:no = 5:3:2 | Ar:N2:co2 = 5:3:2 | Ar:N2 = 5:5 |
|  | Thickness | 110 Å | 110 Å | 110 Å | 110 Å |
| Optical density |  | 3.1 | 2.48 | 2.36 | 2.55 |
| Etching speed |  | 0.8 Å/sec | 1.55 Å/sec | 1.60 Å/sec | 1.48 Å/sec |
| Loading test after forming pattern |  | 8.2 nm | 6.5 nm | 5.8 nm | 7.2 nm |

Referring to Table 1, the comparative examples 1 to 4 show the optical properties of the two-layered light-shielding film containing the chrome (Cr) compound, the etching speed, and the difference in the critical dimension between the resist film pattern and the final light-shielding film pattern after forming the light-shielding film pattern.

In the comparative example 1, the light-shielding film has the thickness of 660 Å and the optical density of 3.1. However, it is difficult to form the resist film not thicker than 1,000 Å since the etching speed is 0.8 Å/sec. Further, the loading test resulted in 8.2 nm. Accordingly, the light-shielding film according to the comparative example 1 is inferior to those of the foregoing embodiments of the present invention.

In the comparative examples 2 to 4, the contents of oxygen (O) or nitrogen (N) were increased in order to Test of Resistance to Chemicals in the Light-Shielding Film According to Composition Ratios of the Molybdenum Chromium (MoCr) Target The light-shielding films were formed while changing the composition ratio of the molybdenum chromium (MoCr) target for the light-shielding film containing the MoCr compound according to the embodiments of the present invention, and tested with respect to the resistance to chemicals by cleaning with sulfuric acid. In the embodiments 7 to 10, the multi-layered structure of two layers were formed using process gas of Ar, $N_2$, $CO_2$, NO, etc., and the cleaning with sulfuric acid was performed at a temperature of 90° C. for 20 minutes.

TABLE 2

|  |  | Embodiment 7 | Embodiment 8 | Embodiment 9 | Embodiment 10 |
|---|---|---|---|---|---|
| Target(composition ratio) |  | Mo:Cr = 10at %:90at % | Mo:Cr = 20at %:80at % | Mo:Cr = 30at %:70at % | Mo:Cr = 40at %:60at % |
| First light-shielding layer | Substances | MoCrCON | MoCrCON | MoCrCON | MoCrON |
|  | Thickness | 500 Å | 500 Å | 500 Å | 500 Å |
| Second light-shielding layer | Substances | MoCrN | MoCrN | MoCrCON | MoCrN |
|  | Thickness | 50 Å | 50 Å | 50 Å | 50 Å |
| Total thickness |  | 550 Å | 550 Å | 550 Å | 550 Å |
| Optical density(OD) |  | 3.04 | 3.02 | 3.02 | 3.02 |
| Etching speed |  | 2.5 Å/sec | 2.65 Å/sec | 2.95 Å/sec | 3.25 Å/sec |
| Cleaning with sulfuric acid | Thickness change | 7 Å | 12 Å | 14 Å | 25 Å |
|  | OD change | 0.01 | 0.01 | 0.022 | 0.058 |

Referring to Table 2, as the content of molybdenum (Mo) increases in the molybdenum chromium (MoCr) target, the etching speed of the light-shielding film was also increased from 2.5 Å/sec to 3.25 Å/sec.

However, changes in the thickness and the optical density due to the cleaning with sulfuric acid were as follows. In the embodiment 10 of using the molybdenum chromium (MoCr) target (composition ratio Mo:Cr=40 at %:60 at %), the thickness was changed by 25 Å and the optical density was changed by 0.058. Hence, it will be appreciated that these conditions are not suitable to form the light-shielding film according to the present invention.

Test of the Light-Shielding Film According to Substances and Composition Ratios

To test the light-shielding film containing the MoCr compound according to the embodiments of the present invention, the light-shielding films were formed while changing the kind of process gas and the amount of injected gas. In the embodiments 11 to 14, the light-shielding films were formed using the same molybdenum chromium (MoCr) target (composition ratio Mo:Cr=10 at %:90 at %).

Table 3 shows test results of the optical properties and the etching speed based on the substances and composition ratios according to the embodiments 11 to 14.

In the embodiment 15, the TaON film was formed using the tantalum (Ta) target. In the embodiment 16, the MoSiON film was formed using the molybdenum silicide (MoSi) target (composition ratio Mo:Si=2 at %:98 at %). In the embodiment 17, the SiON film was formed using the silicon (Si) target.

Table 4 shows results from testing the sheet resistance and the etching speed in accordance with the substances of the hard film.

TABLE 4

|  | Embodiment 15 | Embodiment 16 | Embodiment 17 |
| --- | --- | --- | --- |
| Target(composition ratio) | Ta | Mo:si = 2at %:98at % | Si |
| Hard film    Substances | TaON | MoSiON | SiON |
| Thickness | 40 Å | 40 Å | 40 Å |
| Sheet resistance | 1.23 kΩ/□ | 1.92 kΩ/□ | 2.85 kΩ/□ |
| Etching speed | 2.6 Å/sec | 2.2 Å/sec | 1.8 Å/sec |

Referring to Table 4, the embodiment 17 shows the sheet resistance of 2.85 kΩ/□, which is higher than those of the embodiment 15 and 16, but there is no problem since it is not higher than 30 kΩ/□ required by a transfer apparatus.

TABLE 3

|  |  | Embodiment 11 | Embodiment 12 | Embodiment 13 | Embodiment 14 |
| --- | --- | --- | --- | --- | --- |
| First Light-shielding layer | Substances | MoCrCON | MoCrCON | MoCrCON | MoCrON |
|  | Gas | Ar:N$_2$:CO$_2$ = 3:9:10 | Ar:N$_2$:CO$_2$ = 3:9:10 | Ar:N$_2$:CO$_2$ = 3:9:10 | Ar:N$_2$:NO = 3:9:11 |
|  | Thickness | 500 Å | 500 Å | 500 Å | 500 Å |
| Second light-shielding layer | Substances | MoCrN | MoCrN | MoCrCON | MoCrN |
|  | Gas | Ar:N$_2$ = 5:5 | Ar:N$_2$ = 5:15 | Ar:N$_2$:CO$_2$ = 3:9:10 | Ar:N$_2$ = 5:5 |
|  | Thickness | 50 Å | 50 Å | 50 Å | 50 Å |
| Total thickness |  | 550 Å | 550 Å | 550 Å | 550 Å |
| Optical density(OD) |  | 3.04 | 2.95 | 2.92 | 3.02 |
| Etching speed |  | 2.5 Å/sec | 2.62 Å/sec | 2.93 Å/sec | 2.53 Å/sec |
| Delta TIR |  | 330 Å | 520 Å | 820 Å | 560 Å |

Referring to Table 3, the embodiment 12 increases the content of nitrogen (N) of the second light-shielding layer as compared with the embodiment 11. At this time, the optical density (OD) was decreased to 2.95, but the etching speed was increased to 2.62 Å/sec.

As compared with the embodiment 11, the embodiment 13 shows the second light-shielding layer made of MoCr-CON. Likewise, the optical density (OD) was also decreased to 2.92, but the etching speed was increased to 2.92 Å/sec.

As compared with the embodiment 11, the embodiment 14 shows the first light-shielding layer made of MoCrON, in which the optical density was similarly 3.02, but the etching speed was decreased to 2.53 Å/sec.

The embodiments 11 to 14 all show the optical density (OD) not lower than 2.9, and the etching speed not lower than 2.0 Å/sec. Thus, it will be understood that the resist film can be formed to have a thickness of 1,000 Å.

Test of a Hard Film According to Substances

To test the hard film according to the present invention, the hard film was formed on the light-shielding film of two layers containing the MoCr compound, and the sheet resistance and the etching speed thereof were tested. In the embodiments 15 to 17, the light-shielding films were formed like those of the embodiment 7 and 11, but different in substances of the hard film.

As described above, there are provided a blankmask including a light-shielding film, in which composition or composition ratios of metal and light elements are controlled to thereby guarantee a light-shielding efficiency, increase an etching speed and have a minimum sheet-resistance, and a photomask using the same.

Further, there are provided a blankmask, which can minimize change in critical dimensions of a phase-shift film pattern by raising up the etching speed of the light-shielding film to form the light-shielding film pattern with high accuracy, and using the light-shielding film pattern as the etching mask to form the phase-shift film pattern, and a photomask using the same.

Accordingly, there are provided a blankmask which can achieve a fine pattern of not greater than 32 nm, preferably not greater than 14 nm, and more preferably not greater than 10 nm, and a photomask using the same.

Although a few exemplary embodiments have been shown and described, it will be appreciated by those skilled in the art that changes may be made in these exemplary embodiments without departing from the principles and spirit of the invention. Therefore, the foregoing has to be considered as illustrative only. The scope of the invention is defined in the appended claims and their equivalents.

Accordingly, all suitable modification and equivalents may fall within the scope of the invention.

What is claimed is:

1. A blankmask with a light-shielding film on a transparent substrate, wherein
the light-shielding film comprises a first light-shielding layer; and
the first light-shielding layer comprises chrome (Cr) and molybdenum (Mo), and
wherein the first light-shielding layer has a composition ratio: molybdenum (Mo) of 1 at %~20 at % and chrome (Cr) of 10 at %~80 at %.

2. The blankmask according to claim 1, wherein the first light-shielding film further comprises a second light-shielding layer, and the second light-shielding layer comprises chrome (Cr) and molybdenum (Mo).

3. The blankmask according to claim 2, wherein the first light-shielding layer and the second light-shielding layer comprise a compound that contains one or more kinds of substances among nitrogen (N), oxygen (O), carbon (C), boron (B), fluorine (F) and hydrogen (H) in addition to chrome (Cr) and molybdenum (Mo), and
the first light-shielding layer and the second light-shielding layer have a composition ratio: molybdenum (Mo) of 1 at %~20 at %, chrome (Cr) of 10 at %~80 at %, nitrogen (N) of 0~50 at %, oxygen (O) of 0~50 at %, and carbon (C) of 0~30 at %.

4. The blankmask according to claim 2, wherein the second light-shielding layer has higher optical density per unit thickness (Å) at an exposure wavelength than the first light-shielding layer.

5. The blankmask according to claim 4, wherein the first light-shielding layer comprises oxygen (O) more than the second light-shielding layer.

6. The blankmask according to claim 4, wherein the second light-shielding layer contains more nitrogen (N) than the first light-shielding layer.

7. The blankmask according to claim 4, wherein the first light-shielding layer has a thickness occupying 60%~99% of total thickness of the light-shielding film.

8. The blankmask according to claim 2, wherein the second light-shielding layer has lower optical density per unit thickness (Å) at an exposure wavelength than the first light-shielding layer.

9. The blankmask according to claim 8, wherein the first light-shielding layer comprises one or more between oxygen (O) and nitrogen (N) less than the second light-shielding layer.

10. The blankmask according to claim 8, wherein the first light-shielding layer has a thickness occupying 5%~80% of total thickness of the light-shielding film.

11. The blankmask according to claim 2, wherein one or more light-shielding layers between the first light-shielding layer and the second light-shielding layer further comprise one or more kinds of metallic substances among tantalum (Ta), vanadium (V), cobalt (Co), nickel (Ni), zirconium (Zr), niobium (Nb), palladium (Pd), zinc (Zn), aluminum (Al), manganese (Mn), cadmium (Cd), magnesium (Mg), lithium (Li), selenium (Se), copper (Cu), hafnium (Hf) and tungsten (W).

12. The blankmask according to claim 1, wherein the light-shielding film comprises one or more kinds of metallic substances among tantalum (Ta), vanadium (V), cobalt (Co), nickel (Ni), zirconium (Zr), niobium (Nb), palladium (Pd), zinc (Zn), aluminum (Al), manganese (Mn), cadmium (Cd), magnesium (Mg), lithium (Li), selenium (Se), copper (Cu), hafnium (Hf) and tungsten (W).

13. The blankmask according to claim 1, wherein the light-shielding film has a thickness of 300 Å-700 Å.

14. The blankmask according to claim 1, wherein the light-shielding film has an etching speed of 1.5 Å/sec~3.5 Å/sec.

15. The blankmask according to claim 1, wherein the light-shielding film has an optical density of 2.5~3.5 with respect to an exposure wavelength of 193 nm or 248 nm.

16. The blankmask according to claim 1, wherein the light-shielding film has a surface reflectivity of 10%~50% with respect to an exposure wavelength of 193 nm or 248 nm.

17. The blankmask according to claim 1, further comprising one or more among a hard film provided on the light-shielding film, a phase-shift film provided beneath the light-shielding film, and an etching-stopping film interposed between the hard film and the light-shielding film.

18. The blankmask according to claim 17, wherein the phase-shift film has a transmissivity of 5%~40% with respect to an exposure light having a wavelength of 193 nm or 248 nm.

19. The blankmask according to claim 17, wherein the hard film has a thickness of 10 Å~100 Å.

20. The blankmask according to claim 17, wherein the phase-shift film, the hard film and the etching-stopping film comprise one or more kinds of metallic substances such as molybdenum (Mo), tantalum (Ta), vanadium (V), cobalt (Co), nickel (Ni), zirconium (Zr), niobium (Nb), palladium (Pd), zinc (Zn), chrome (Cr), aluminum (Al), manganese (Mn), cadmium (Cd), magnesium (Mg), lithium (Li), selenium (Se), copper (Cu), hafnium (Hf) and tungsten (W), or comprise one or more kinds of substances among silicon (Si), nitrogen (N), oxygen (O), carbon (C), boron (B) and hydrogen (H) in addition to the metallic substances.

21. The blankmask according claim 1, further comprising an anti-reflective layer that is provided at least either of on or beneath the light-shielding film and contains one or more kinds of substances among nitrogen (N), oxygen (O), carbon (C), boron (B), fluorine (F) and hydrogen (H) in addition to chrome (Cr) or molybdenum chromium (MoCr).

22. The blankmask according to claim 1, wherein the first light-shielding layer is formed by a sputtering process using a molybdenum chromium (MoCr) target.

23. The blankmask according to claim 22, wherein the target comprises a molybdenum chromium (MoCr) single target having a composition ratio of molybdenum (Mo): chrome (Cr)=1 at %~30 at %:70 at %~99 at %.

24. The blankmask according to claim 22, wherein the first light-shielding layer is formed by a co-sputtering process using two or more kinds of targets among molybdenum (Mo), chrome (Cr) and molybdenum chromium (MoCr).

25. The blankmask according to claim 24, wherein the molybdenum chromium (MoCr) target has a composition ratio of molybdenum (Mo):chrome (Cr)=1 at %~50 at %:50 at %~99 at %.

26. The blankmask according to claim 1, wherein the first light-shielding film further comprises a second light-shielding layer, and the second light-shielding layer comprises chrome (Cr).

27. The blankmask according to claim 26, wherein one or more light-shielding layers between the first light-shielding layer and the second light-shielding layer further comprise one or more kinds of metallic substances among tantalum (Ta), vanadium (V), cobalt (Co), nickel (Ni), zirconium (Zr), niobium (Nb), palladium (Pd), zinc (Zn), aluminum (Al), manganese (Mn), cadmium (Cd), magnesium (Mg), lithium (Li), selenium (Se), copper (Cu), hafnium (Hf) and tungsten (W).

28. The blankmask according to claim 26, wherein the light-shielding layer further comprises one or more kinds of substances among nitrogen (N), oxygen (O), carbon (C), boron (B), fluorine (F) and hydrogen (H) in addition to chrome (Cr) and molybdenum (Mo), and the second light-shielding layer further comprises one or more kinds of substances among nitrogen (N), oxygen (O), carbon (C), boron (B), fluorine (F) and hydrogen (H), in addition to chrome (Cr).

29. A photomask fabricated using the blankmask according to claim 1.

\* \* \* \* \*